US010317432B2

(12) United States Patent
Sakamoto et al.

(10) Patent No.: US 10,317,432 B2
(45) Date of Patent: Jun. 11, 2019

(54) CURRENT SENSOR AND METHOD FOR MANUFACTURING CURRENT SENSOR

(71) Applicant: YAZAKI CORPORATION, Tokyo (JP)

(72) Inventors: Akinori Sakamoto, Shizuoka (JP); Shinichi Hashio, Shizuoka (JP); Shidi Peng, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 387 days.

(21) Appl. No.: 14/728,533

(22) Filed: Jun. 2, 2015

(65) Prior Publication Data

US 2015/0260762 A1    Sep. 17, 2015

Related U.S. Application Data

(63) Continuation of application No. PCT/JP2013/082438, filed on Dec. 3, 2013.

(30) Foreign Application Priority Data

Dec. 3, 2012 (JP) ................. 2012-264524

(51) Int. Cl.
G01R 1/18 (2006.01)
G01R 3/00 (2006.01)
G01R 15/20 (2006.01)
(52) U.S. Cl.
CPC ............ G01R 15/207 (2013.01); G01R 1/18 (2013.01); G01R 3/00 (2013.01)

(58) Field of Classification Search
CPC ... G01R 15/202; G01R 15/205; G01R 15/207
See application file for complete search history.

(56) References Cited

U.S. PATENT DOCUMENTS 6,426,617 B1    7/2002 Haensgen et al.
8,963,537 B2    2/2015 Racz et al.
(Continued)

FOREIGN PATENT DOCUMENTS

CH    705 027 A1    11/2012
JP    H09-304447 A    11/1997
(Continued)

OTHER PUBLICATIONS

English language of the Written Opinion of the International Search Report for PCT/JP2013/082438 dated Mar. 4, 2014.
(Continued)

Primary Examiner — Noam Reisner
(74) Attorney, Agent, or Firm — Kenealy Vaidya LLP

(57) ABSTRACT

A current sensor includes a magnetic detection element configured to detect magnetism produced from a current path and a magnetic shield core. The magnetic shield core includes a core portion arranged so as to extend around the current path such that the current path is positioned therein, a gap portion formed by cutting a part of the core portion and in which the magnetic detection element is arranged, and at least a pair of shield portions extending from the core portion toward the outside opposite to the inside of the core portion where the current path is arranged, so as to correspond to the magnetic detection element.

12 Claims, 10 Drawing Sheets

(56) References Cited

U.S. PATENT DOCUMENTS

| | | | |
|---|---|---|---|
| 2006/0232262 A1* | 10/2006 | Tanizawa | G01R 15/183 |
| | | | 324/117 H |
| 2012/0306486 A1 | 12/2012 | Racz et al. | |
| 2013/0187633 A1* | 7/2013 | Yasui | G01R 15/207 |
| | | | 324/117 R |
| 2014/0253100 A1* | 9/2014 | Lepine | G01R 19/00 |
| | | | 324/126 |

FOREIGN PATENT DOCUMENTS

| | | |
|---|---|---|
| JP | 2002-303642 A | 10/2002 |
| JP | 2005-70037 A | 3/2005 |
| JP | 2006-292692 A | 10/2006 |
| JP | 2007-147514 A | 6/2007 |
| JP | 2008-224260 A | 9/2008 |
| JP | 2010-2277 A | 1/2010 |
| JP | 2010-8050 A | 1/2010 |
| JP | 2010-71822 A | 4/2010 |
| JP | 2010-78586 A | 4/2010 |
| JP | 4515855 B2 | 8/2010 |
| JP | 2010-223868 A | 10/2010 |
| JP | 2012-154831 A | 8/2012 |
| JP | 2012-247420 A | 12/2012 |

OTHER PUBLICATIONS

International Search Report for PCT/JP2013/082438 dated Mar. 4, 2014.

Japanese Office Action for the related Japanese Patent Application No. 2012-264524 dated Jun. 30, 2016.

Japanese Office Action for the related Japanese Patent Application No. 2012-264524 dated Nov. 30, 2016.

Japanese Decision to Decline the Amendment for the related Japanese Patent Application No. 2012-264524 dated Apr. 27, 2017.

Japanese Decision of Refusal for the related Japanese Patent Application No. 2012-264524 dated Apr. 27, 2017.

Japanese Report of Reconsideration by the Examiner before Appeal for the related Japanese Patent Application No. 2012-264524 dated Sep. 1, 2017.

Japanese Office Action for the related Japanese Patent Application No. 2012-264524 dated Mar. 6, 2018.

German Office Action for the related German Patent Application No. 11 2013 005 763.8 dated Mar. 15, 2018.

* cited by examiner

CURRENT SENSOR AND METHOD FOR MANUFACTURING CURRENT SENSOR

CROSS REFERENCE TO RELATED APPLICATION

This application is a continuation of PCT application No. PCT/JP2013/082438, which was filed on Dec. 3, 2013 based on Japanese Patent Application (No. 2012-264524) filed on Dec. 3, 2012, the contents of which are incorporated herein by reference. Also, all the references cited herein are incorporated as a whole.

BACKGROUND

1. Technical Field

The present invention relates to a current sensor used for measuring a current flowing through a current path and a method for manufacturing the current sensor.

2. Background Art

In order to measure a current of a battery mounted on a vehicle or a current to be supplied to a motor, a current sensor which is provided with a magnetic detection element such as a hall element and a magnetic shield core, detects magnetism produced from a current path such as a bus bar, and measures a current flowing through a current path has been used (see JP-A-2010-223868, JP-A-2010-2277 and JP-B-4515855, for example)

In this context, flowing of a large current (600 A, for example) through a current path such as a bus bar has been studied as electrical vehicles and the like have widely been distributed in recent years.

In order to detect such a current flowing through the current path, a current sensor with a structure in which a magnetic shield core 500 extending around the current path 600 is used to detect magnetism by a magnetic detection element 400 as illustrated in FIGS. 10A and 10B can be considered. If it is attempted to measure the current of the current path 600, through which a large current is made to flow, by the current sensor, a current value measured by the current sensor becomes smaller than an actual current value, and a relationship between the current value measured by the current sensor and the actual current value cannot maintain linearity. This is because the magnetic shield core 500 cannot sufficiently converge a magnetic flux produced from the current path 600 at a gap portion 510 and a so-called magnetically saturated state occurs at the core portion.

As countermeasures for the magnetic saturation at the core portion, the following two countermeasures can be considered.

(1) Density of a magnetic flux (a magnetic flux per unit area) converged by the core portion is reduced by increasing a width of the core portion to increase areas of end surfaces of the core portion, which face each other at the gap portion.

(2) Density of a magnetic flux converged by the core portion is reduced by widening the gap portion of the core portion to increase the interval between the two end surfaces of the core portion, which face each other at the gap portion, and to increase resistance at the gap portion.

However, the aforementioned countermeasure (1) has a problem in that the size of the magnetic shield core increases, and the aforementioned countermeasure (2) has another problem in that magnetic field noise, which flies from the outside to the current sensor and is not a target of detection, has a greater influence.

In order to solve such problems, a current sensor provided with a magnetic shield core 500 formed in a U shape as illustrated in FIG. 11 can be considered. According to the current sensor, the current flowing through the current path 600 concentrates on both sides of the bus bar, which corresponds to the current path 600, in the width direction. Then, a magnetic flux produced from the current flowing on both sides of the current path 600, as a generation source, becomes dominant in the magnetic flux detected by the magnetic detection element 400. If a distance between the generation source and the magnetic detection element 400 increases, a phase difference is generated between a magnetic field produced from the generation source and a magnetic field which reaches the magnetic detection element 400. For this reason, the magnetic flux detected by the magnetic detection element 400 is delayed relative to the current flowing through the current path 600, and accordingly, responsiveness of the current sensor deteriorates.

SUMMARY

The present invention was made in view of the above circumstances, and an object thereof is to provide a current sensor which achieves high-speed responsiveness without causing an increase in size of the core portion and the drawing of the magnetic field noise in order to suppress magnetic saturation at the core portion, and to provide a method for manufacturing the current sensor.

Solution to Problem

In order to achieve the aforementioned object, the current sensor according to the present invention has the following features (1) and (2).

(1) A current sensor includes:
a magnetic detection element configured to detect magnetism produced from a current path; and
a magnetic shield core, which includes a core portion arranged so as to extend around the current path, a gap portion formed by cutting a part of the core portion such that the magnetic detection element is arranged therein, and two shield portions extending from the core portion toward the outside, which is opposite to the inside of the core portion where the current path is arranged, such that the two shield portions are parallel to each other and the magnetic detection element is arranged therebetween.

(2) The current sensor with the configuration (1), wherein the magnetic shield core includes an inner shield arranged so as to extend around the current path and an outer shield with a U shape arranged along an outer circumference of the inner shield;
wherein the inner shield and a part of the outer shield arranged along the outer circumference of the inner shield are formed as the core portion;
wherein the gap portion is formed in the inner shield; and
wherein both end portions of the outer shield form the shield portion.

According to the current sensor with the aforementioned the configuration (1), the two shield portions are provided at the core portion of the magnetic shield core. Accordingly, magnetic field noise from the outside has less influence even if an influence of the magnetic saturation at the core portion is suppressed by widening the interval of the gap portion. In addition, since the core portion extends around the current path and the current flowing through the current path is uniformly distributed in the cross section of the current path, responsiveness does not deteriorate.

That is, it is possible to achieve high-speed responsiveness without causing an increase in size of the core portion and drawing of the magnetic field noise in order to suppress the magnetic saturation at the core portion.

According to the current sensor with the aforementioned configuration (2), it is possible to simplify the shapes of the inner shield and the outer shield and to manufacture the current sensor at a low cost by press molding or the like by configuring the magnetic shield core from the inner shield and the outer shield as separate bodies. In addition, since a main function of the outer shield is to block an external magnetic field, it is possible to reduce the thickness of the outer shield as compared with the inner shield and to achieve a decrease in size, weight, and cost of the magnetic shield core.

Furthermore, since the portion of the magnetic shield core, at which the inner shield and the outer shield are overlapped, has a thicker thickness, it is possible to reduce magnetic flux density as a magnetic flux, which converges at the core portion, per unit area.

In order to achieve the aforementioned object, the method for manufacturing a current sensor according to the present invention has the following features (3) to (5).

(3) A method for manufacturing a current sensor configured to detect magnetism produced from a current path by a magnetic detection element and measure a current flowing through the current path, the method including:

forming a magnetic shield core, which includes a core portion arranged so as to extend around a current path, a gap portion formed by cutting a part of the core portion such that the magnetic detection element is arranged therein, and two shield portions extending from the core portion toward the outside, which is opposite to the inside of the core portion where the current path is arranged, such that the two shield portions are parallel to each other and the magnetic detection element is arranged therebetween, wherein in the forming of the magnetic shield cores, the shield portion is formed to have a longitudinal dimension based on an external magnetic field attenuation rate.

(4) The method for manufacturing a current sensor with the configuration (3), wherein in the forming of the magnetic shield core, the gap portion is formed to have an interval based on magnetic flux density in the magnetic detection element.

(5) The method for manufacturing a current sensor with the configuration (3) or (4), wherein in the forming of the magnetic shield core, the magnetic shield core is formed separately as an inner shield arranged so as to extend around the current path and an outer shield with a U shape arranged along an outer circumference of the inner shield, the inner shield and a part of the outer shield arranged along the outer circumference of the inner shield are formed as the core portion, the inner shield forms the gap portion, both end portions of the outer shield form the shield portion, and a portion where the inner shield and the outer shield are overlapped is formed to have a thickness based on a relationship between the current which is made to flow through the current path and maximum magnetic flux density in the core portion.

According to the current sensor with the aforementioned configuration (3), it is possible to readily set the longitudinal dimension of the shield portion based on the external magnetic field attenuation rate and to obtain a current sensor with excellent resistance against an external magnetic field.

According to the current sensor with the aforementioned configuration (4), it is possible to readily adjust a measurement range of a current to be measured without changing an amplification factor of an amplifier circuit or the like, by setting the interval of the gap portion based on the magnetic flux density at the magnetic detection element. In addition, it is possible to share the magnetic field generated in the magnetic detection element in each measurement range by adjusting the interval of the gap portion.

According to the current sensor with the aforementioned configuration (5), it is possible to readily set the thickness of the portion at which the inner shield and the outer shield are overlapped, based on the relationship between the current which is made to flow through the current path and the maximum magnetic flux density at the core portion.

According to the present invention, it is possible to provide a current sensor which achieves high-speed responsiveness without causing an increase in size of the core portion and drawing of magnetic field noise in order to suppress magnetic saturation at the core portion, and to provide a method for manufacturing the current sensor.

The brief description of the present invention was given hitherto. Details of the present invention will be further clearly understood by thoroughly reading embodiments for implementing the present invention (hereinafter referred to as "embodiments") described below with reference to accompanying drawings.

BRIEF DESCRIPTION OF THE DRAWINGS

FIGS. 7A and 7B are respectively front views of the magnetic shield core.

FIG. 10A is a perspective view and FIG. 10B is a front view.

DETAILED DESCRIPTION OF THE EXEMPLARY EMBODIMENTS

Hereinafter a detailed description will be given of exemplary embodiments of the present invention with reference to drawings.

First Embodiment

First, a description will be given of a current sensor according to a first embodiment.

Figure 1:
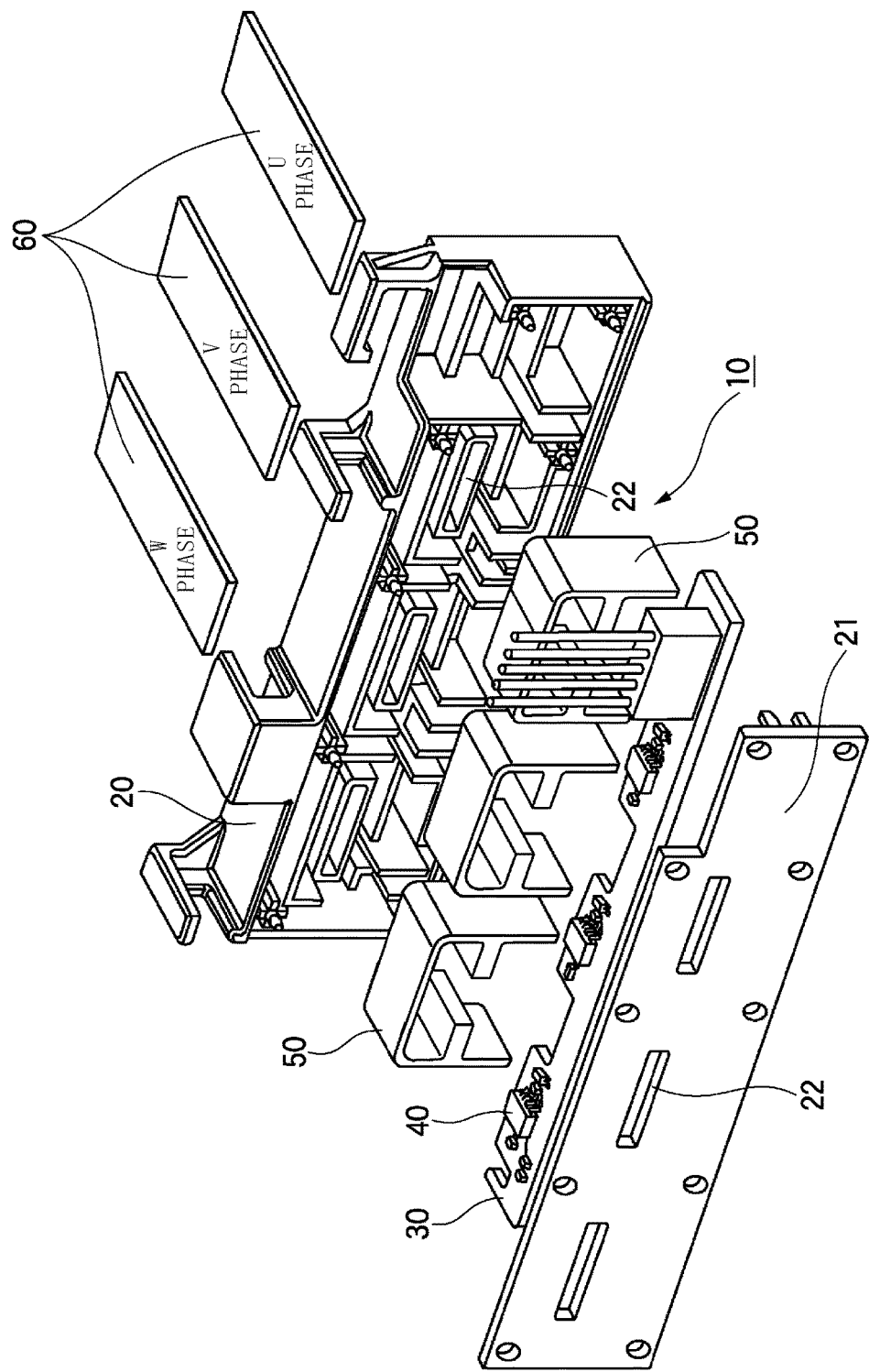
FIG. 1 is an exploded perspective view illustrating a current sensor according to a first embodiment.
Figure 2:
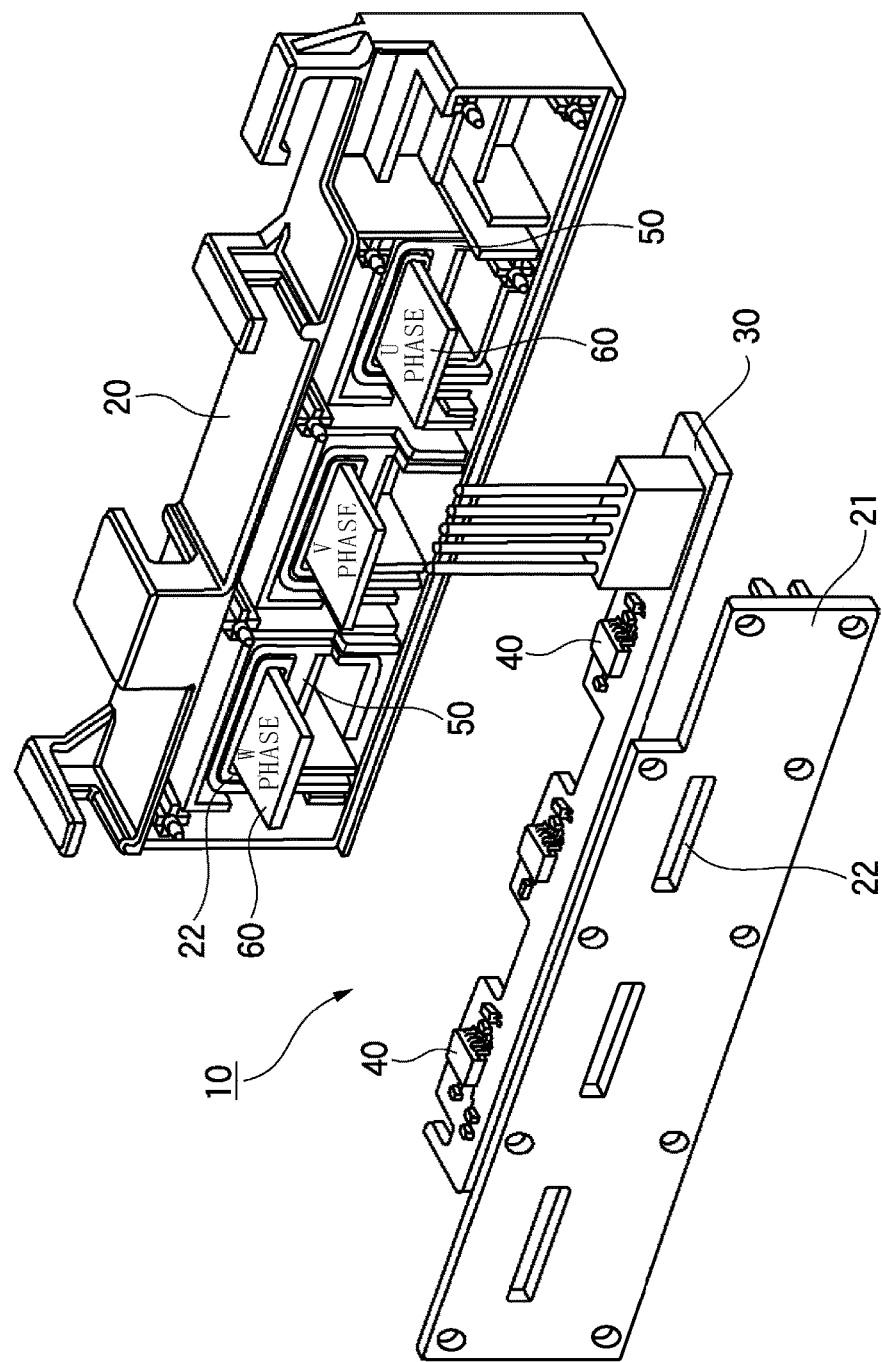
FIG. 2 is an exploded perspective view illustrating the current sensor in FIG. 1 in the course of assembly.
Figure 3:
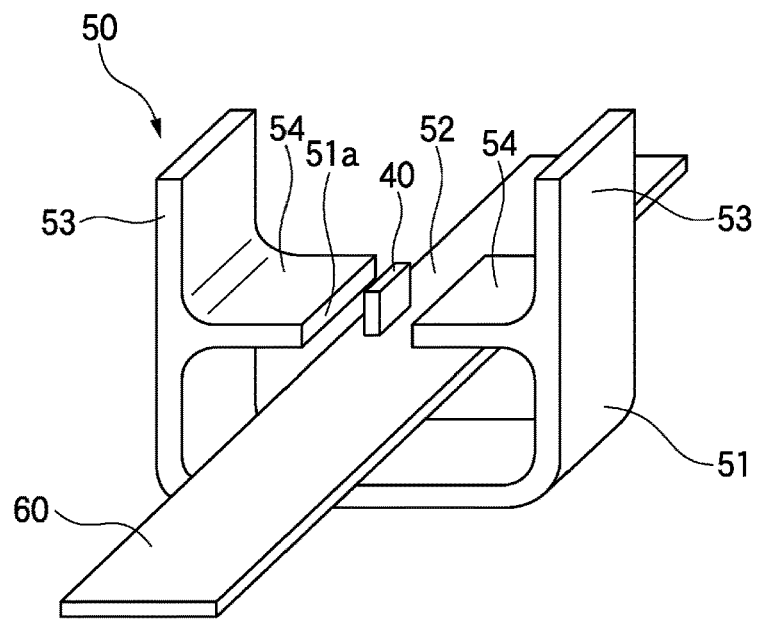
FIG. 3 is a perspective view of a magnetic shield core in the current sensor according to the first embodiment.
Figure 4:
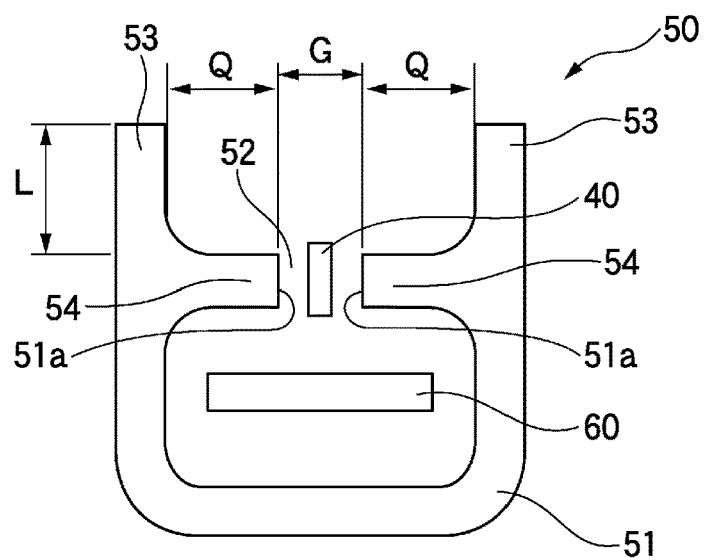
FIG. 4 is a front view of the magnetic shield core in the current sensor according to the first embodiment.

FIG. 1 is an exploded perspective view illustrating the current sensor according to the first embodiment, FIG. 2 is a perspective view of the current sensor in FIG. 1 in the course of assembly, FIG. 3 is a perspective view of a magnetic shield core in the current sensor according to the first embodiment, and FIG. 4 is a front view of the magnetic shield core in the current sensor according to the first embodiment.

As illustrated in FIGS. 1 and 2, the current sensor 10 is configured to include a housing 20, a substrate 30 accommodated in the housing 20, magnetic detection elements 40 mounted on the substrate 30, and magnetic shield cores 50 accommodated in the housing 20. According to the current sensor 10, current paths 60 are arranged between the magnetic detection elements 40 and the magnetic shield cores 50, and the magnetic detection elements 40 detect a current flowing through the current paths 60. The current sensor 10 measures a connector current or the like connected to a three-phase AC motor drive current for an electrical vehicle or a hybrid car or a three-phase AC path, for example.

The housing 20 substantially has a box shape and is formed of insulating synthetic resin or the like. The current sensor 10 is completed by accommodating the substrate 30 and the magnetic shield cores 50 in the housing 20 at predetermined positions from a side of an opening and engaging a cover 21 with the housing 20, which holds the substrate 30 and the magnetic shield cores 50, on the side of the opening and fixing the cover 21 thereto. A plurality of through holes 22 are provided in each of the housing 20 and the cover 21, and the current paths 60 are arranged at predetermined positions in the current sensor 10 by inserting the current paths 60 into the through holes 22. In so doing, the current sensor 10 can detect a current flowing through the current paths 60. The magnetic detection elements 40 which are mounted on the substrate 30 along with circuits and the like are elements configured to measure magnetic fields generated in the current paths 60. Each magnetic detection element 40 is a semiconductor hall element that utilizes a hall effect caused by Lorentz force applied to a carrier in a magnetic field or a magnetic impedance element that utilizes a magnetic impedance effect caused by an amorphous magnetic material, for example. The current sensor 10 outputs a voltage value, which is a value proportional to the magnetic field detected by the magnetic detection elements 40, through an amplifier circuit or the like mounted on the substrate 30. The magnetic shield cores 50 substantially have thin film shapes, and are made of a material with high magnetic permeability such as permalloy or a silicon steel sheet. The current paths 60 are bus bars or conductive bodies, each of which is formed in a flat plate shape, and through which an AC current or the like flows.

Since the current sensor 10 according to the present invention is installed to have a three-phase AC configuration as follows.

The number of current paths 60 is three for the three-phase AC configuration (a U phase, a V phase, and a W phase from the right side of the drawing). In contrast, the magnetic detection element 40 for detecting a current flowing through each current path 60 is arranged for the current path 60 of each phase in the current sensor 10. In addition, the respective magnetic detection elements 40 are integrally mounted on a single substrate 30. The magnetic shield cores 50 are arranged so as to correspond to the respective magnetic detection elements 40 and respectively surround the magnetic detection elements 40 and the current paths 60. The respective current paths 60 are arranged in the respective through holes 22 provided in the housing 20 and the cover 21. According to the embodiment of the present invention, the current paths 60 are arranged between the magnetic detection elements 40 and the magnetic shield cores 50 (see FIGS. 3 and 4).

The magnetic detection elements 40 mounted on the substrate 30 are accommodated in the housing 20 so as to be positioned at centers of the through holes 22. As a result, the magnetic detection elements 40 are arranged at the centers of the current paths 60 that are inserted into the through holes 22. The respective magnetic shield cores 50 are arranged so as to surround the through holes 22 of the housing 20 by being accommodated in the housing 20.

As illustrated in FIGS. 3 and 4, each magnetic shield core 50 includes a core portion 51 that extends around each current path 60 when the current sensor 10 is attached to the current path 60. The core portion 51 has a hollow tubular shape as a whole and includes a gap portion 52 and projecting portions 54, the gap portion 52 being formed by cutting a part of the core portion 51 on the side of the magnetic detection element 40 and the projecting portions 54 being respectively positioned on both sides of the gap portion 52 and form a part of the core portion 51. Each magnetic detection element 40 is arranged between end surfaces (hereinafter referred to as core portion end surfaces 51a) of the projecting portions 54 extending toward the gap portion 52, which face the gap portion 52. An interval G of the gap portion 52 can be adjusted by appropriately changing a dimension Q of the projecting length of the projecting portions 54. In addition, the dimension Q of the projecting length of the projecting portions 54 indicates a length from an inner surface of a shield portion 53, which will be described later, to the core portion end surface 51a. It is preferable that each magnetic detection element is arranged at the gap portion 52. However, a configuration is also applicable in which the magnetic detection element is arranged so as to slightly deviate in a direction in which the magnetic detection element 40 approaches the current path 60 or in a direction in which the magnetic detection element 40 is away from the current path 60 with respect to the gap portion 52.

In addition, each magnetic shield core 50 includes two shield portions 53 extending from the core portion 51 toward the outside which is opposite to the inside of the core portion 51 where the current path 60 is positioned. These shield portions 53 are arranged so as to be parallel to each other, and the magnetic detection element 40 is arranged between these shield portions 53. The magnetic shield core 50 with the aforementioned configuration is formed by molding granular ferrite with a mold, burning and solidifying the molded article, and further shaping the obtained object by a processing apparatus such as a cutting machine. The core portion 51, the gap portion 52, and the shield portions 53 are formed by being molded with a mold or being shaped by using a processing apparatus.

Figure 10A:
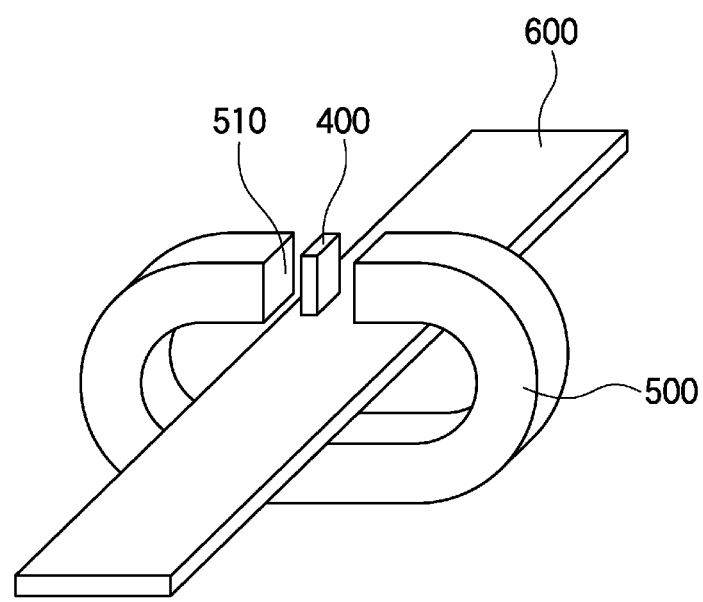
FIGS. 10A and 10B are diagrams illustrating a magnetic shield core extending around a current path, where
Figure 10B:
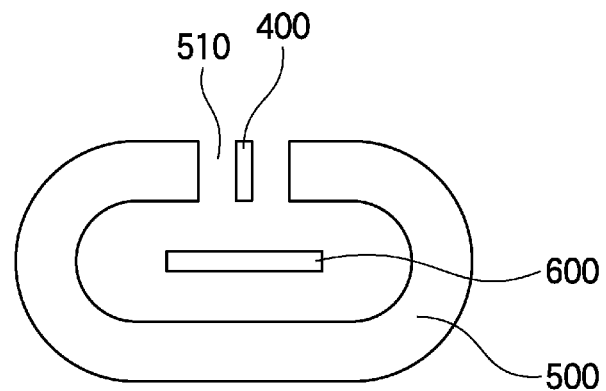

According to a magnetic shield core (see FIGS. 10A and 10B) of a prior invention, which extends around each current path, a magnetic flux produced from each current path cannot sufficiently be converged at the gap portion when a large current (600 A, for example) is made to flow through the current path, a magnetically saturated state occurs, and a relationship between a current value measured by the current sensor and an actual current value cannot maintain linearity in some cases.

As a countermeasure for such a case, reducing density of the magnetic flux converged by the cover portion by increasing the width of the core portion or by increasing the interval of the gap portion can be considered. However, an increase in width of the core portion causes an increase in size of the magnetic shield core, and an increase in interval of the gap portion causes external magnetic field noise to have a greater influence.

Figure 11:
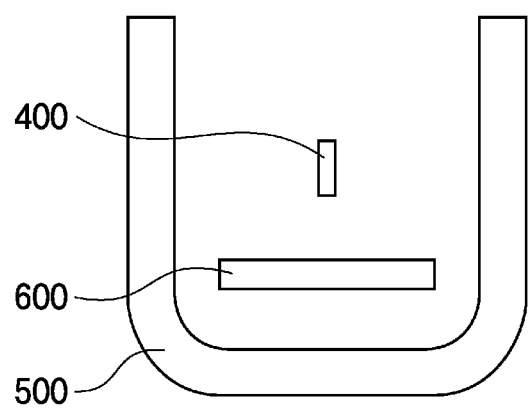
FIG. 11 is a front view illustrating a magnetic shield core with a U shape.

According to a magnetic shield core (see FIG. 11) with a U shape, the current flowing through each current path concentrates on both sides of the current path in the width direction, and a magnetic flux produced from the current flowing through both sides of the current path, as a generation source, becomes dominant in the magnetic flux to be detected by the magnetic detection element. For this reason, if the distance between the generation source and the magnetic detection element increases, a phase difference occurs in the magnetic field produced from the generation source and the magnetic field which reaches the magnetic detection element and the responsiveness deteriorates.

In contrast, the two shield portions 53 are provided at the core portion 51 in the magnetic shield core 50 in the current sensor 10 according to the first embodiment illustrated in FIG. 2. With such a configuration, the magnetic field noise from the outside has less influence even if the influence of the magnetic saturation at the core portion 51 is suppressed by increasing the interval G of the gap portion 52. In addition, since the core portion 51 extends around the current path 60 and the current flowing through the current path 60 is uniformly distributed in the cross section of the current path 60, the responsiveness does not deteriorate.

That is, it is possible to achieve high-speed responsiveness without causing an increase in size of the core portion 51 and drawing of the magnetic field noise in order to suppress the magnetic saturation at the core portion 51.

Figure 5:
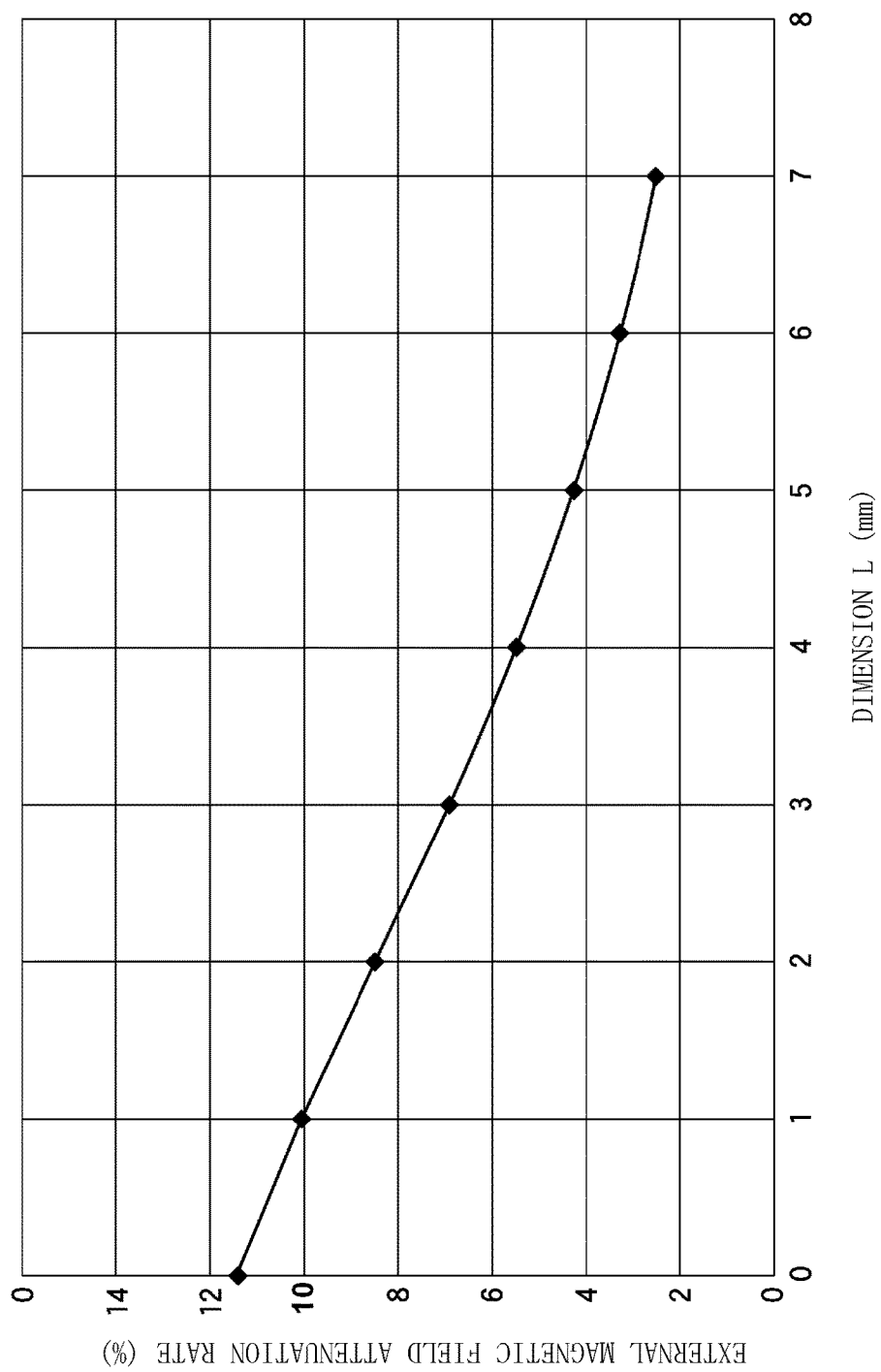
FIG. 5 is a graph illustrating a relationship between a longitudinal dimension of a shield portion and an external magnetic field attenuation rate.

FIG. 5 illustrates a relationship between a longitudinal dimension L (dimension L) of each shield portion 53 and an external magnetic field attenuation rate (attenuation rate= (internal magnetic field/external magnetic field)×100) as resistance against the external magnetic field.

As illustrated in FIG. 5, the longitudinal dimension L of each shield portion 53 has an influence on the resistance against the external magnetic field. Accordingly, it is possible to readily set the longitudinal dimension L of each shield portion 53 in the magnetic shield core 50 based on the relationship with the resistance against the external magnetic field. That is, it is possible to readily set the longitudinal dimension L of each shield portion 53 from a targeted external magnetic field attenuation rate based on the relationship between the longitudinal dimension L of each shield portion 53 and the external magnetic field attenuation rate.

Here, an output of the magnetic detection element 40 is amplified by the amplifier circuit or the like with a predetermined amplifier factor, and targeted input and output properties are obtained. However, a required current measurement range differs depending on an application used. Since a dynamic range of the output (from a lower limit value to an upper limit value of an output voltage) is common to the respective applications, it is necessary to change the amplification factor of the amplifier circuit or the like for each measurement range. That is, according to the general current sensor 10, it is necessary to change a circuit component for determining the amplification factor for each measurement range (for each application).

However, the current sensor according to the embodiment has a structure in which the gap portion 52 is provided at the core portion 51 and the magnetic detection element 40 is arranged at the gap portion 52. With such a structure, it is possible to readily adjust the measurement range of the current to be measured without changing the amplification factor of the amplifier circuit or the like, by changing the dimension Q of the projecting length of each projecting portion 54 and adjusting the interval G of the gap portion 52. In addition, it is possible to cause a magnetic field to be generated in a standardized manner in the magnetic detection element 40 in any measurement range by changing the dimension Q of the projecting length of each projecting portion 54 and adjusting the interval G of the gap portion 52.

By causing the current to flow through the current path 60 as described above, the magnetic field generated in the magnetic detection element 40 varies depending on the interval G of the gap portion 52. Accordingly, it is possible to cause the same magnetic field at different current values by changing the dimension Q of the projecting length of each projecting portion 54 and adjusting the interval G of the gap portion 52 in accordance with the measurement range.

Figure 6:
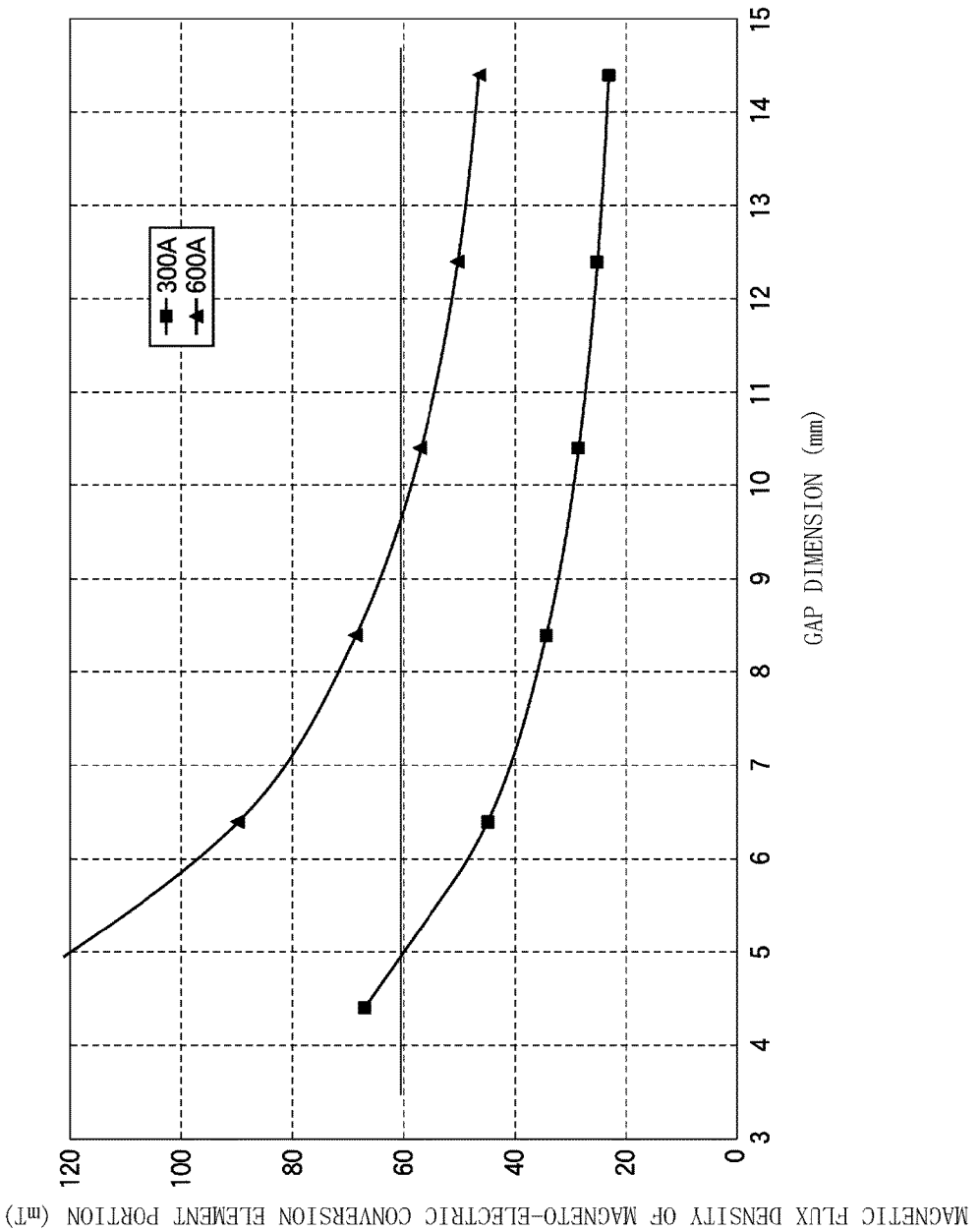
FIG. 6 is a graph illustrating a relationship between an interval of a gap portion and a generated magnetic field (magnetic flux density) when a current of 300 A and a current of 600 A are made to flow through a current path.

FIG. 6 illustrates a relationship between the interval (gap dimension) G of the gap portion 52 and a generated magnetic field (magnetic flux density at the magnetic detection element) when a current of 300 A and a current of 600 A are made to flow through the current path 60.

As illustrated in FIG. 6, the magnetic field with a magnetic flux density generated at the magnetic detection element 40 has such a relationship that the magnetic field decreases as the interval G of the gap portion 52 increases.

It is possible to generate the same magnetic field (magnetic flux density) 60 mT by setting the interval G of the gap portion 52 to 5 mm in the case of the measurement range of 300 A and by setting the interval G of the gap portion 52 to 9.8 mm in the case of the measurement range of 600 A.

Figure 7A:
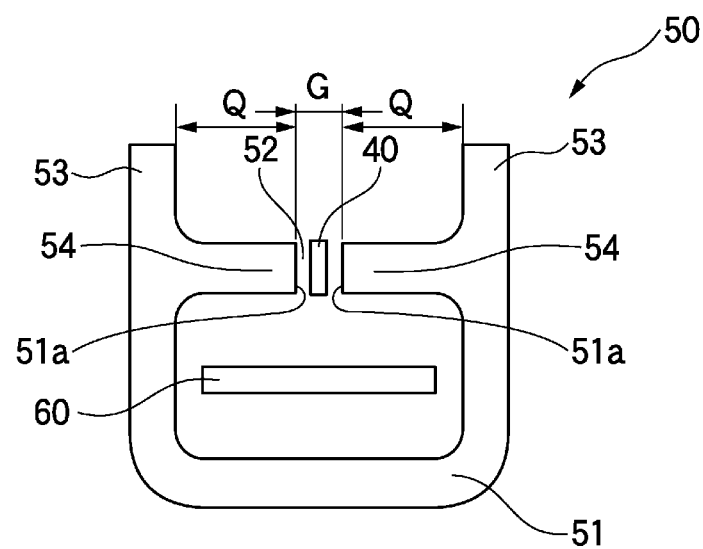
FIGS. 7A and 7B are diagrams illustrating magnetic shield cores including gap portions with different intervals, where
Figure 7B:
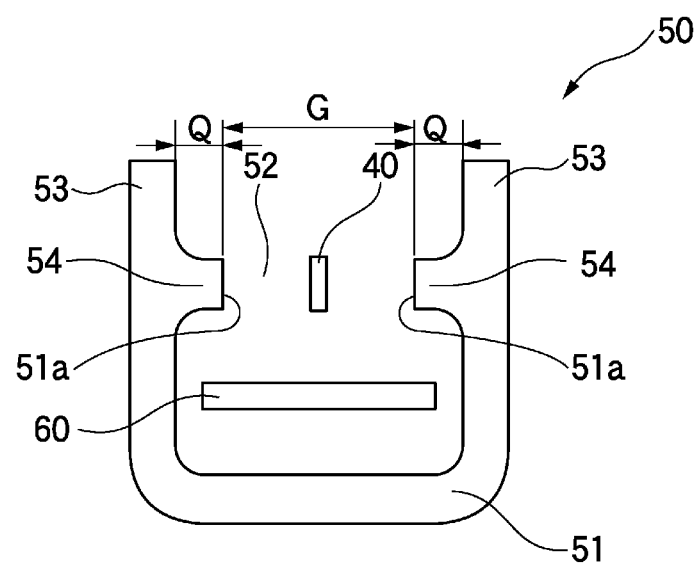

Accordingly, in the case of reducing the measurement range, the dimension Q of the projecting length of each projecting portion 54 is set to be long, and the interval G of the gap portion 52 is narrowed as illustrated in FIG. 7A. In contrast, in the case of increasing the measurement range, the dimension Q of the projecting length of each projecting portion 54 is set to be short, and the interval G of the gap portion 52 is widened as illustrated in FIG. 7B. By so doing, it is made possible to generate the same magnetic field in the magnetic detection element 40 when the maximum current in each measurement range is made to flow.

Thus, it is made possible to use in a standardized manner the amplification factor of the amplifier circuit or the like for all the measurement ranges and to use in a standardized manner the circuit component in a signal processing circuit. As a result, it is made possible to readily manufacture the current sensor 10 and provide the current sensor at a low cost.

In the case of the magnetic shield core (see FIGS. 10A and 10B) with no shield portions 53, resistance against the external magnetic field deteriorates if the interval of the gap portion is widened. However, since the magnetic shield core 50 according to the embodiment is provided with the shield portions 53, it is possible to minimize the deterioration of the resistance against the external magnetic field due to an increase in the interval G of the gap portion 52.

Second Embodiment

Next, a description will be given of a current sensor according to a second embodiment, in which the same reference numerals are given to the same components as those in the first embodiment, and the descriptions thereof will be omitted.

Figure 8:
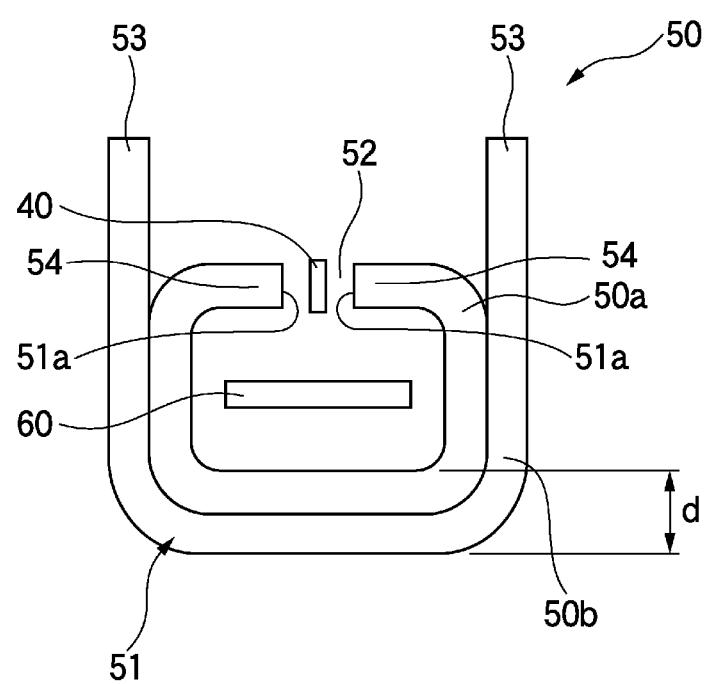
FIG. 8 is a front view of a magnetic shield core in a current sensor according to a second embodiment.

As illustrated in FIG. 8, a magnetic shield core 50 which configures the current sensor 10 according to the second embodiment includes an inner shield 50a and an outer shield 50b.

The inner shield 50*a* is formed in a ring shape so as to extend around the current path 60. In addition, a gap portion 52 is formed in the inner shield 50*a* on the side of the magnetic detection element 40 by cutting a part of the inner shield 50*a*, and projecting portions 54 which are positioned on both sides of the gap portion 52 are formed.

The outer shield 50*b* is formed in a substantially U shape and is arranged along the outer circumference of the inner shield 50*a*. A part of the outer shield 50*b* along the outer circumference of the inner shield 50*a* configures the core portion 51 along with the inner shield 50*a*. Both end portions of the outer shield 50*b* are made to function as the shield portions 53 extending toward the outside which is opposite to the inside of the core portion 51 where the current path 60 is positioned.

As described above, the current sensor 10 according to the second embodiment includes the magnetic shield core 50 configured of the inner shield 50*a* and the outer shield 50*b* which are formed as separate bodies. Since the shield portions 53 of the outer shield 50*b* are also provided in this configuration, the magnetic noise from the outside has less influence even if the influence of the magnetic saturation at the core portion 51 is suppressed by increasing the interval G of the gap portion 52. In addition, since the core portion 51 surrounds the current path 60 and the current flowing through the current path 60 is uniformly distributed in the cross section of the current path 60, responsiveness does not deteriorate.

That is, it is possible to achieve high-speed responsiveness without causing an increase in size of the core portion 51 and drawing of the magnetic noise in order to suppress the magnetic saturation at the core portion 51.

Particularly, according to the current sensor of the second embodiment, it is possible to simplify the shapes of the inner shield 50*a* and the outer shield 50*b* and to manufacture the current sensor at a low cost by press molding or the like by configuring the magnetic shield core 50 as the inner shield 50*a* and the outer shield 50*b* are separate bodies. In addition, since the main function of the outer shield 50*b* is blocking the external magnetic field, it is possible to reduce the thickness of the outer shield 50*b* as compared with the inner shield 50*a*. Accordingly, it is possible to achieve a decrease in size, weight, and cost of the magnetic shield core 50.

Furthermore, since the thickness of the portion where the inner shield 50*a* and the outer shield 50*b* are overlapped in the magnetic shield core 50, that is, a bottom portion and both side portions of the core portion 51 increases in the second embodiment, it is possible to reduce the magnetic flux density as a magnetic flux, which is converged by the core portion 51, per unit area.

In addition, it is not necessary that the entire surface of the inner shield 50*a* is in contact with the entire surface of the outer shield 50*b* at the portion where the inner shield 50*a* and the outer shield 50*b* are overlapped. However, it is possible to further suppress the occurrence of the magnetic saturation at the core portion 51 if the entire surfaces thereof are in contact with each other.

According to the magnetic shield core 50 configured of two components, namely the inner shield 50*a* and the outer shield 50*b*, it is possible to satisfactorily measure a current while suppressing the occurrence of magnetic saturation even if a large current flows through the current path 60, by adjusting a plate thickness d of the portion, at which the inner shield 50*a* and the outer shield 50*b* are overlapped, in the core portion 51 in accordance with the amount of current which is made to flow through the current path 60.

Figure 9:
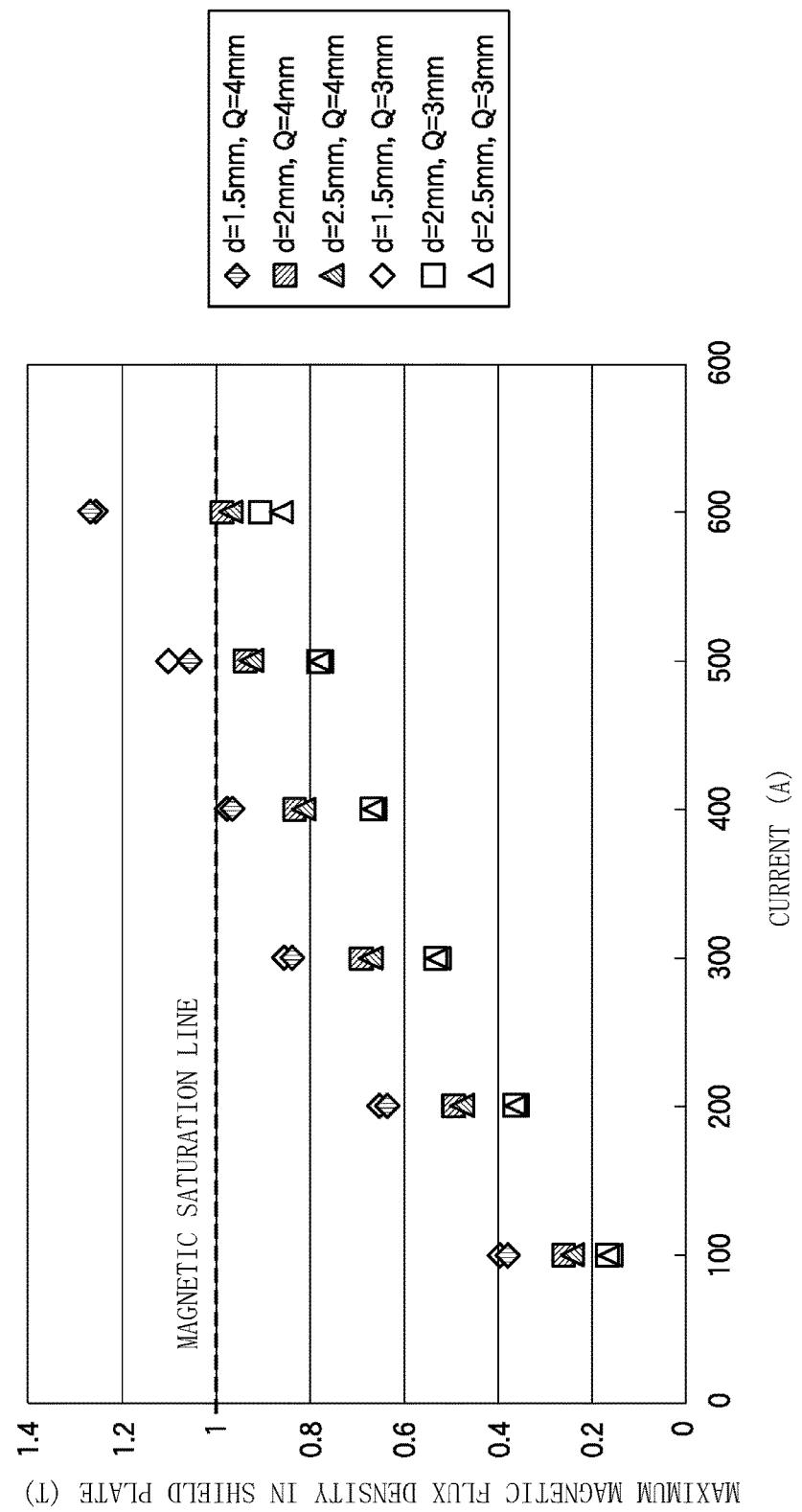
FIG. 9 is a graph illustrating a relationship between an amount of a current and magnetic flux density for each thickness of the thickest portion of a core portion.

FIG. 9 illustrates a relationship between a current amount and the maximum magnetic flux density at the core portion 51 (in the shield plate) for each thickness d of the maximum thickness portion in the core portion 51. In FIG. 9, values of the magnetic shield core 50 in the cases in which the dimension Q of the projecting length of each projecting portion 54 is 4 mm and 3 mm are illustrated.

As illustrated in FIG. 9, the magnetic flux density decreases and the plate thickness d of the core portion 51 in the magnetic shield core 50 increases.

Based on this fact, it is possible to know that it is only necessary to set the plate thickness d of the portion, at which the inner shield 50*a* and the outer shield 50*b* are overlapped, of the magnetic shield core 50 to be an optimal value (equal to or greater than 2 mm, for example) with which magnetic saturation is not caused, in order to handle the large current (600 A, for example).

As described above, it is possible to readily set the thickness d of the portion at which the inner shield 50*a* and the outer shield 50*b* are overlapped based on the relationship between the current that is made to flow through the current path 60 and the maximum magnetic flux density at the core portion 51.

As described above, the current sensor according to the second embodiment has a structure of the two components, namely the inner shield 50*a* and the outer shield 50*b*, and the inner shield 50*a* has an effect of high-speed responsiveness and an effect of strengthening the magnetic field to be applied to the magnetic detection element 40 when the current is made to flow through the current path 60.

In this context, the density of the generated magnetic flux and a rate of variation also increase as a frequency and a current value of the AC current flowing through the current path 60 increase. Since the current path 60 is positioned at the center of the AC magnetic field that significantly varies, an eddy current is generated on the surface and the inside of the current path 60 for inhibiting the variations in the magnetic field due to a principle of electromagnetic induction. Furthermore, since a higher opposing magnetic flux is produced as the frequency and the current value increase, the eddy current inside the current path 60 gradually concentrates on the surface, and the current density distributes in a non-uniform manner.

In contrast, according to the magnetic shield core 50 provided with the inner shield 50*a*, a magnetic flux leaking from the core portion 51 is canceled by the magnetic flux accompanying the eddy current, the eddy current is thus suppressed, and the current density in the cross section of the current path 60 is uniformly distribute. Since it is also possible to cancel a remaining magnetic flux in the magnetic detection element 40 during the offset of the current, delay caused by the magnetic circuit is solved, and the magnetic detection element 40 can obtain a high-speed responding property even at the center thereof. In addition, it is possible to detect a large current without causing magnetic saturation by optimizing three dimensions, namely the plate thickness d of the core portion 51, the interval G of the gap portion 52, and a depth dimension W of the core portion 51 with respect to the maximum current value. In addition, it is possible adjust the density of the magnetic flux to be applied to the magnetic detection element 40 regardless of how large the maximum current value is by adjusting the interval G of the gap portion 52 and the depth dimension W of the core portion 51.

According to the magnetic shield core 50, the outer shield 50*b* exhibits a high blocking effect against the external magnetic field. Accordingly, it is possible to cause the outer shield 50b to reliably block the magnetic flux applied from the outside to the magnetic detection element 40 as compared with a structure in which the external magnetic field is blocked by the core portion covering the magnetic detection element, for example.

According to the current sensor of the second embodiment, it is possible to cancel phase deviation and to obtain high-speed responsiveness as described above. In addition, it is possible to detect a large current by adjusting the plate thickness d, the interval G of the gap portion 52, and the depth dimension W of the core portion 51. Furthermore, it is possible to obtain a satisfactory resistance against the external magnetic field, by which a ferromagnetic field is blocked from any directions by the shield portions 53 in the outer shield 50b such that the ferromagnetic field has substantially no influence on the magnetic detection element 40.

According to a general magnetic shield core, the gap portion is formed by cutting a part of the core portion which is obtained by laminating and bonding thin magnetic materials, and magnetic annealing is performed thereon, which brings about an increase in processing cost. Accordingly, the three-phase AD current sensor which employs three magnetic shield cores requires a high cost.

In contrast, according to the current sensor of the second embodiment, it is possible to manufacture the magnetic shield core 50 merely by bending a magnetic material by press working which facilitates the fabrication and then performing magnetic annealing, to achieve a decrease in size and weight, and to thereby significantly reduce the processing cost. Accordingly, it is possible to suppress the cost of the three-phase AC current sensor which employs the three magnetic shield cores.

The present invention is not limited to the aforementioned embodiments, and modifications, improvements, and the like can be appropriately made. In addition, materials, shapes, dimensions, numbers, arrangement positions, and the like of the respective components in the aforementioned embodiments may be arbitrarily set as long as the present invention can be achieved and are not limited.

Here, features of the aforementioned embodiments of the current sensor and the method for manufacturing the current sensor according to the present invention will be briefly summarized below in [1] to [5].

[1] A current sensor (10) including:
a magnetic detection element (40) configured to detect magnetism produced from a current path (60); and
a magnetic shield core (50), that includes a core portion (51) arranged so as to extend around the current path, a gap portion (52) formed by cutting a part of the core portion and in which the magnetic detection element is arranged, and two shield portions (53) extending from the core portion toward the outside, which is opposite to the inside of the core portion where the current path is arranged, the two shield portions extending in parallel to each other so that the magnetic detection element is arranged therebetween.

[2] The current sensor according to [1], wherein the magnetic shield core includes an inner shield (50a) arranged so as to extend around the current path and an outer shield (50b) with a U shape arranged along an outer circumference of the inner shield;
wherein the inner shield and a part of the outer shield arranged along the outer circumference of the inner shield are formed as the core portion;
wherein the gap portion is formed in the inner shield; and
wherein both end portions of the outer shield form the shield portion.

[3] A method for manufacturing a current sensor (10) configured to detect magnetism produced from a current path (60) by a magnetic detection element (40) and measure a current flowing through the current path, the method comprising:
forming a magnetic shield core (50), including a core portion (51) arranged so as to extend around the current path, a gap portion (52) formed by cutting a part of the core portion such that the magnetic detection element is arranged therein, and two shield portions (53) extending from the core portion toward the outside, which is opposite to the inside of the core portion where the current path is arranged, the two shield portions extending parallel to each other such that the magnetic detection element is arranged therebetween,
wherein in the forming of the magnetic shield core, the shield portion is formed to have a longitudinal dimension based on an external magnetic field attenuation rate.

[4] The method for manufacturing a current sensor according to [3], wherein in the forming of the magnetic shield core, the gap portion is formed to have an interval based on magnetic flux density in the magnetic detection element.

[5] The method for manufacturing a current sensor according to [3] or [4], wherein in the forming of the magnetic shield core, the magnetic shield core is formed separately as an inner shield (50a) arranged so as to extend around the current path and an outer shield (50b) with a U shape arranged along an outer circumference of the inner shield, the inner shield and a part of the outer shield arranged along the outer circumference of the inner shield are formed as the core portion, the inner shield forms the gap portion, both end portions of the outer shield form the shield portion, and a portion where the inner shield and the outer shield are overlapped is formed to have a thickness based on a relationship between the current which is made to flow through the current path and maximum magnetic flux density in the core portion.

Although the present invention was described above in detail with reference to specific embodiments, it is obvious for those skilled in the art that various modifications and amendments can be made without departing from the spirit and the scope of the present invention.

According to the current sensor of the present invention, it is possible to achieve high-speed responsiveness without causing an increase in size of the core portion and drawing of magnetic field noise in order to suppress magnetic saturation at the core portion. The present invention which can achieve the effect is useful in the field of a current sensor used for measuring a current flowing through a current path and a method for manufacturing the current sensor.

What is claimed is:
1. A current sensor comprising:
a magnetic detection element configured to detect magnetism produced from a current path; and
a magnetic shield core, including;
a core portion arranged so as to extend around the current path such that the current path is positioned therein;
a gap portion formed by cutting a part of the core portion and in which the magnetic detection element is arranged; and
at least a pair of shield portions configured to shield a magnetic noise from outside of the current sensor and extending from the core portion toward the outside opposite to the inside of the core portion where the current path is arranged, so as to correspond to the magnetic detection element, wherein the core portion has a pair of side wall extending in a top-bottom direction perpendicular to a extending direction of the current path, and an upper wall and a bottom wall extending in a width direction perpendicular to the top-bottom direction, the pair of shield portions straight stands toward an upper end thereof from the whole of both end portions of the upper wall of the core portion in the width direction to be faced to each other, wherein the magnetic detection element is only one magnetic detection element provided with respect to one magnetic shield core, the gap portion is formed such that the core portion includes a pair of projecting portions spaced apart from each other by the gap portion, and the pair of shield portions terminate at respective free ends and extend only perpendicular to the projecting portions.

2. The current sensor according to claim 1, wherein the magnetic shield core includes an inner shield arranged so as to extend around the current path and an outer shield with a U shape arranged along an outer circumference of the inner shield;

wherein the inner shield and a part of the outer shield arranged along the outer circumference of the inner shield are formed as the core portion;

wherein the gap portion is formed in the inner shield; and wherein both end portions of the outer shield form the shield portion.

3. A current sensor comprising:

a housing;

a plurality of current paths arranged in the housing;

magnetic detection elements configured to detect magnetism produced from the current paths and arranged for the respective current paths; and magnetic shield cores each of which are arranged for each of the current paths, and the each of the magnetic shield cores including;

a core portion arranged so as to extend around a corresponding current path; and a gap portion formed by cutting a part of a corresponding core portion such that a corresponding magnetic detection element is arranged therein, wherein a first magnetic shield core and a second magnetic shield core arranged so as to be adjacent to the first magnetic shield core are provided as the magnetic shield cores; and wherein at least one of the first and second magnetic shield cores includes a shield portion configured to shield a magnetic noise from outside of the current sensor and arranged between a first current path around which the core portion of the first magnetic shield core extends and a second current path around which the core portion of the second magnetic shield core extends, at the outside of the core portion of the at least one of the first and second magnetic shield cores that is opposite to the inside thereof where the corresponding current path is arranged, the core portion has a pair of side wall extending in a top-bottom direction perpendicular to a extending direction of the current path, and an upper wall and a bottom wall extending in a width direction perpendicular to the top-bottom direction, the pair of shield portions straight stands toward an upper end thereof from the whole of both end portions of the upper wall of the core portion in the width direction to be faced to each other, each of the magnetic detection elements is only one magnetic detection element provided with respect to each of the magnetic shield cores, the gap portion is formed such that the core portion includes a pair of projecting portions spaced apart from each other by the gap portion, and the shield portion terminates at a free end and extends only perpendicular to the projecting portions.

4. The current sensor according to claim 3, wherein the at least one of the first and second magnetic shield cores includes a pair of shield portions which are arranged with the gap portion positioned therebetween as the shield portion; and wherein one of the pair of shield portions is arranged between the first current path and the second current path.

5. The current sensor according to claim 3, wherein each of the magnetic shield cores includes an inner shield arranged so as to extend around the corresponding current path and an outer shield with a U shape arranged along an outer circumference of the inner shield;

wherein the inner shield and a part of the outer shield arranged along the outer circumference of the inner shield are formed as the corresponding core portion;

wherein the gap portion is formed in the inner shield; and wherein both end portions of the outer shield form the shield portion.

6. A method for manufacturing a current sensor configured to detect magnetism produced from a current path by a magnetic detection element and measure a current flowing through the current path, the method comprising:

forming a magnetic shield core including;

a core portion arranged so as to extend around the current path such that the current path is positioned therein;

a gap portion formed by cutting a part of the core portion and in which the magnetic detection element is arranged; and at least a pair of shield portions configured to shield a magnetic noise from outside of the current sensor and extending from the core portion toward the outside opposite to the inside of the core portion where the current path is arranged, so as to correspond to the magnetic detection element, wherein in the forming of the magnetic shield core, a longitudinal dimension of the shield portion is formed based on an external magnetic field attenuation rate, the core portion has a pair of side wall extending in a top-bottom direction perpendicular to a extending direction of the current path, and an upper wall and a bottom wall extending in a width direction perpendicular to the top-bottom direction, the pair of shield portions straight stands toward an upper end thereof from the whole of both end portions of the upper wall of the core portion in the width direction to be faced to each other, the magnetic detection element is only one magnetic detection element provided with respect to one magnetic shield core, the gap portion is formed such that the core portion includes a pair of projecting portions spaced apart from each other by the gap portion, and the pair of shield portions terminate at respective free ends and extend only perpendicular to the projecting portions.

7. The method for manufacturing the current sensor according to claim 6, wherein the forming of the magnetic shield core further comprises:

forming an interval of the gap portion based on magnetic flux density in the magnetic detection element.

8. The method for manufacturing the current sensor according to claim 6, wherein the forming of the magnetic shield core further comprises:

forming the magnetic shield core such that the magnetic shield core separately includes an inner shield arranged so as to extend around the current path and an outer shield with a U shape arranged along an outer circumference of the inner shield;

forming the inner shield and a part of the outer shield arranged along the outer circumference of the inner shield as the core portion;

forming the gap portion in the inner shield;

forming both end portions of the outer shield as the shield portion; and forming a thickness of a portion where the inner shield and the outer shield are overlapped based on a relationship between the current flowing through the current path and maximum magnetic flux density in the core portion.

9. A method for manufacturing a current sensor configured to detect magnetism produced from current paths arranged in a housing by magnetic detection elements arranged for the respective current paths and measure currents flowing through the current paths, the method comprising:

forming magnetic shield cores which are arranged for the respective current paths, and each of the magnetic shield cores including;

a core portion arranged so as to extend around a corresponding current path; and a gap portion formed by cutting a part of a corresponding core portion such that the corresponding magnetic detection element is arranged therein, wherein in the forming of the magnetic shield cores, as each of the magnetic shield cores, a first magnetic shield core and a second magnetic shield core are formed so that the first magnetic shield core is adjacent to the second magnetic shield core, and at least one of the first and second magnetic shield cores includes a shield portion configured to shield a magnetic noise from outside of the current sensor and arranged between a first current path around which the core portion of the first magnetic shield core extends and a second current path around which the core portion of the second magnetic shield core extends, at the outside of the core portion of the at least one of the first and second magnetic shield cores that is opposite to the inside thereof where the corresponding current path is arranged; and wherein in the forming of the magnetic shield cores, a longitudinal dimension of each of the shield portion is formed based on an external magnetic field attenuation rate, the core portion has a pair of side wall extending in a top-bottom direction perpendicular to a extending direction of the current path, and an upper wall and a bottom wall extending in a width direction perpendicular to the top-bottom direction, the pair of shield portions straight stands toward an upper end thereof from the whole of both end portions of the upper wall of the core portion in the width direction to be faced to each other, each of the magnetic detection elements is only one magnetic detection element provided with respect to each of the magnetic shield cores, the gap portion is formed such that the core portion includes a pair of projecting portions spaced apart from each other by the gap portion, and the shield portion terminates at a free end and extends only perpendicular to the projecting portions.

10. The method for manufacturing the current sensor according to claim 9, wherein in the forming of the magnetic shield cores, the at least one of the first and second magnetic shield cores includes a pair of shield portions which are arranged with the corresponding gap portion positioned therebetween as the shield portion, and one of the pair of shield portions is arranged between the first current path and the second current path.

11. The method for manufacturing the current sensor according to claim 9, wherein the forming of the magnetic shield cores further comprises:

forming an interval of the gap portion of each of the magnetic shield cores based on magnetic flux density in the corresponding magnetic detection element.

12. The method for manufacturing the current sensor according to claim 9, wherein the forming of the magnetic shield cores further comprises:

forming the magnetic shield cores such that each of the magnetic shield cores separately includes an inner shield arranged so as to extend around the corresponding current path and an outer shield with a U shape arranged along an outer circumference of the corresponding inner shield;

forming the inner shield and a part of the outer shield of each of the magnetic shield cores arranged along the outer circumference of the inner shield as the corresponding core portion;

forming the gap portion in the corresponding inner shield;

forming both end portions of the corresponding outer shield as the shield portion; and forming a thickness of a portion where the inner shield and the outer shield of each of the magnetic shield cores are overlapped based on a relationship between the current flowing through the corresponding current path and maximum magnetic flux density in the core portion.

* * * * *